US007076221B2

(12) United States Patent
Lee et al.

(10) Patent No.: US 7,076,221 B2
(45) Date of Patent: Jul. 11, 2006

(54) DIGITAL AUTOMATIC FINE TUNING METHOD AND APPARATUS

(75) Inventors: Young Jin Lee, Inchun (KR); Hyo Seok Kwon, Suwon (KR); Won Jin Baek, Kyungki-do (KR); Jin Taek Lee, Kyungki-do (KR); Hyun Hwan Yoo, Seoul (KR); Jeong Ki Choi, Suwon (KR)

(73) Assignee: Samsung Electro-Mechanics Co., Ltd, Kyungki-do (KR)

( * ) Notice: Subject to any disclaimer, the term of this patent is extended or adjusted under 35 U.S.C. 154(b) by 424 days.

(21) Appl. No.: 10/695,758

(22) Filed: Oct. 30, 2003

(65) Prior Publication Data

US 2005/0048936 A1 Mar. 3, 2005

(30) Foreign Application Priority Data

Aug. 26, 2003 (KR) ............... 10-2003-0059071

(51) Int. Cl.
*H04B 1/18* (2006.01)
*H04N 5/50* (2006.01)

(52) U.S. Cl. .................. 455/182.3; 455/192.3; 348/731

(58) Field of Classification Search ............. 455/179.1, 455/180.1, 182.1, 182.2, 182.3, 186.1, 188.1, 455/192.1, 192.2, 192.3, 195.1; 348/725, 348/731

See application file for complete search history.

(56) References Cited

U.S. PATENT DOCUMENTS

| 4,121,162 | A | * | 10/1978 | Alberkrack et al. | ..... 455/180.1 |
| 4,249,259 | A | * | 2/1981 | Oda et al. | ................ 455/182.3 |
| 4,262,364 | A | * | 4/1981 | Fujita | ....................... 455/182.3 |
| 4,429,415 | A | * | 1/1984 | Chin et al. | ............... 455/192.3 |
| 5,163,164 | A | | 11/1992 | Tults | ....................... 455/182.3 |
| 6,400,420 | B1 | * | 6/2002 | Kim | .......................... 348/731 |

* cited by examiner

*Primary Examiner*—Quochien B. Vuong
(74) *Attorney, Agent, or Firm*—Lowe Hauptman & Berner, LLP

(57) ABSTRACT

Disclosed herein is a digital automatic fine tuning method and apparatus, which is capable of detecting a difference between a nominal frequency and an intermediate frequency generated in a tuner using a counter, and applying the counted data of the counter as a fine tuning value for the intermediate frequency without using a decoder by controlling the reset and preset operations of the counter that counts the frequency of the intermediate frequency.

9 Claims, 9 Drawing Sheets

DIGITAL AUTOMATIC FINE TUNING METHOD AND APPARATUS

BACKGROUND OF THE INVENTION

1. Field of the Invention

The present invention relates generally to a digital automatic fine tuning method and apparatus, which is capable of detecting a difference between a nominal frequency and an intermediate frequency generated in a tuner using a counter.

2. Description of the Prior Art

In general, apparatuses for processing broadcasting signals, such as televisions, Video Cassette Recorder (VCRs) or set-top boxes, are each equipped with a tuner for receiving high frequency broadcasting signals of a selected channel.

FIG. 1 shows a schematic block diagram of the tuner, where RF sources are high frequency broadcasting signals of a plurality of channels, including modulated image, color, and voice carrier. In this tuner, a Radio Frequency (RF) amplifying unit 11 receives the RF sources, and selects and amplifies a RF signal of the RF sources corresponding to a channel selected by a user. A mixing unit 12 combines the selected RF signal with a local oscillation signal LO having a frequency corresponding to the selected channel to produce an Intermediate Frequency (IF) signal IF. The IF signal IF is an output signal of the tuner, and is applied to a next image/voice processing unit 14 to be separated into an image signal and a voice signal.

In that case, when the user selects the channel through a user manipulation unit 19 so that the RF amplifying unit 11 tunes to and amplifies the RF signal of the channel selected by the user and the mixing unit 12 generates the local oscillation frequency ($f_{LO}=f_{RF}-f_{IF}$) required to convert a frequency of the channel selected by the user into a predetermined IF $f_{IF}$, a microprocessor 18 informs a tuning voltage generating unit 16 of the selected channel and the tuning voltage generating unit 16 applies a tuning voltage $V_T$ corresponding to the selected channel to the RF amplifying unit 11 and a local oscillation unit 15, respectively, so that a tuning frequency of the RF amplifying unit 11 and an oscillation frequency of the local oscillation unit 15 can be varied.

In general, a carrier frequency of a broadcasting signal may be varied when the broadcasting signal is broadcasted from a broadcasting station. In addition, in the tuner, the oscillation frequency of the local oscillation unit 15 may be varied. In this case, the IF produced in the mixing unit 12 may be changed, which results in the distortion of an image.

In the prior art, in order to place the IF produced in the mixing unit 12 on the nominal frequency (refer to a predetermined IF; for example, in the case of a NTSC broadcasting, it is set to 45.75 MHz for an image signal, and 41.25 MHz for a voice signal) by reducing a difference between these frequencies, the tuner further includes an automatic fine tuning unit 17 that detects an IF of a signal applied to the image/voice processing unit 14, calculates a difference between the detected IF and a predetermined nominal frequency, and transmits the calculated difference to the microprocessor 18 that calculates an automatic fine tuning value based on the difference received from the automatic fine tuning unit 17 and transmits the calculated automatic fine tuning value to the tuning voltage generating unit 16. Then, the tuning voltage generating unit 16 corrects the tuning voltage by the automatic fine tuning value, so that the IF is coincident with the predetermined nominal frequency.

The automatic fine tuning unit 17 is implemented as an analog circuit that uses an output frequency of a Voltage Controlled Oscillator (VCO) having an Inductance/Capacitance (LC) tank circuit as its input and tunes a magnitude of inductance L at the outside of an Integrated Circuit (IC). However, since it is impossible to integrate the LC tank circuit in the IC, there was proposed a digital automatic fine tuning apparatus that uses a VCO, in which resistors and capacitors are integrated in an IC, according to the trend of downsizing and multifunction and does not require any external tuning.

However, although this digital automatic fine tuning apparatus does not have an analog circuit such as an LC tank circuit, a problem arises in that a logic circuit for performing the automatic fine tuning function as described above becomes complicated. Accordingly, there is a need for a new digital automatic fine tuning apparatus with a simplified construction.

SUMMARY OF THE INVENTION

Accordingly, the present invention has been made keeping in mind the above problems occurring in the prior art, and an object of the present invention is to provide a digital automatic fine tuning method and apparatus, which is capable of detecting a difference between a nominal frequency and an IF generated in a tuner using a counter.

Another object of the present invention is to provide a digital automatic fine tuning method and apparatus, which is capable of applying counting data as fine tuning values for an IF without a decoder by controlling the reset and preset operations of a counter that counts the IF.

In order to accomplish the above objects, the present invention provides a digital automatic fine tuning method, including the steps of setting a frequency detection resolution 'a' of an Intermediate Frequency (IF) signal and a nominal frequency $f_0$; calculating a reference counted value X from the nominal frequency $f_0$ and the detection resolution 'a' according to the follow Equation, $X:f_0=X+1:f_0+a$, and a window period 'b' which is time required to count to the reference counted value X; receiving an IF signal; resetting a window counter for counting the window period and a frequency counter unit for counting a frequency to respective initial values; counting frequency detection time using the window counter and a frequency of the received IF signal using the frequency counter unit; determining whether a counted value of the window counter reaches the calculated window period 'b'; if it is determined that the counted value of the window counter reaches the window period 'b', detecting a counted value 'd' of the frequency counter unit; and outputting an automatic fine tuning signal corresponding to a difference between the detected counted value 'd' and the calculated reference counted value X and returning to the step of resetting.

Preferably, the digital automatic fine tuning method further includes the steps of, before the step of receiving the IF signal, setting a preset value 'c' so that state values of predetermined bits become "0" at an end point of the window period at the time of the frequency counting of the IF signal having a frequency equal to the nominal frequency, on the basis of the calculated reference counted value X; after the step of counting the frequency using the window counter and the frequency counter unit, determining whether a counted frequency value reaches the preset value 'c'; and if it is determined that the counted frequency value reaches the preset value 'c', presetting the frequency counter unit to an initialization value, wherein the step of outputting the automatic fine tuning signal is performed in such a way that counted frequency data detected at the end point of the window period are output as automatic fine tuning data.

Preferably, only data of predetermined lower bits of the counted frequency data detected at the end point of the window period are used as the automatic fine tuning data.

In addition, the present invention provides a digital automatic fine tuning apparatus, including a frequency counter unit for receiving an IF signal and counting a frequency of the received IF signal; a window generation unit for generating a window signal to set a frequency detection period of the IF signal; a control unit for resetting or presetting the frequency counter unit based on the window signal generated in the window generation unit; a latch unit operated in response to the window signal output from the window generation unit to detect a counted value of the frequency counter unit at an end point of window and maintain the detected counted value for predetermined time; and an output unit for outputting a counted frequency value output from the latch unit as automatic fine tuning data representing a difference between the frequency of the IF signal and a nominal frequency.

Preferably, the frequency counter unit is a down counter for counting down from a preset value set in the control unit.

Preferably, the window generation unit includes an oscillating means for generating a predetermined reference frequency; and a counting means for dividing the reference frequency generated in the oscillating means and generating a window signal corresponding to a window period required to count a reference counted value.

Preferably, the digital automatic fine tuning apparatus further includes an automatic fine tuning determination unit for checking the counted frequency value output from the latch unit and determining whether the received IF signal falls within an automatic fine tuning range, above the automatic fine tuning range, or below the automatic fine tuning range, wherein the output unit outputs the automatic fine tuning data when it is determined that the received IF signal falls within an automatic fine tuning range.

Preferably, the digital automatic fine tuning apparatus further includes a digital/analog converter unit for converting the automatic fine tuning data output from the output unit into an analog signal according to a frequency-voltage curve for automatic fine tuning.

Preferably, the control unit sets a preset value so that state values of predetermined bits become "0" at an end point of the window period at the time of the frequency counting of the IF signal having a frequency equal to the nominal frequency on the basis of a reference counted value X that is a counted value of the nominal frequency, resets the window generation unit and the frequency counter unit by synchronizing them with each other, checks an operation of the frequency counter unit, and presets the frequency counter unit for a preset period.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Hereinafter, the construction and operation of a digital automatic fine tuning method and apparatus of the present invention will be described in detail in conjunction with the accompanying drawings.

Figure 2:
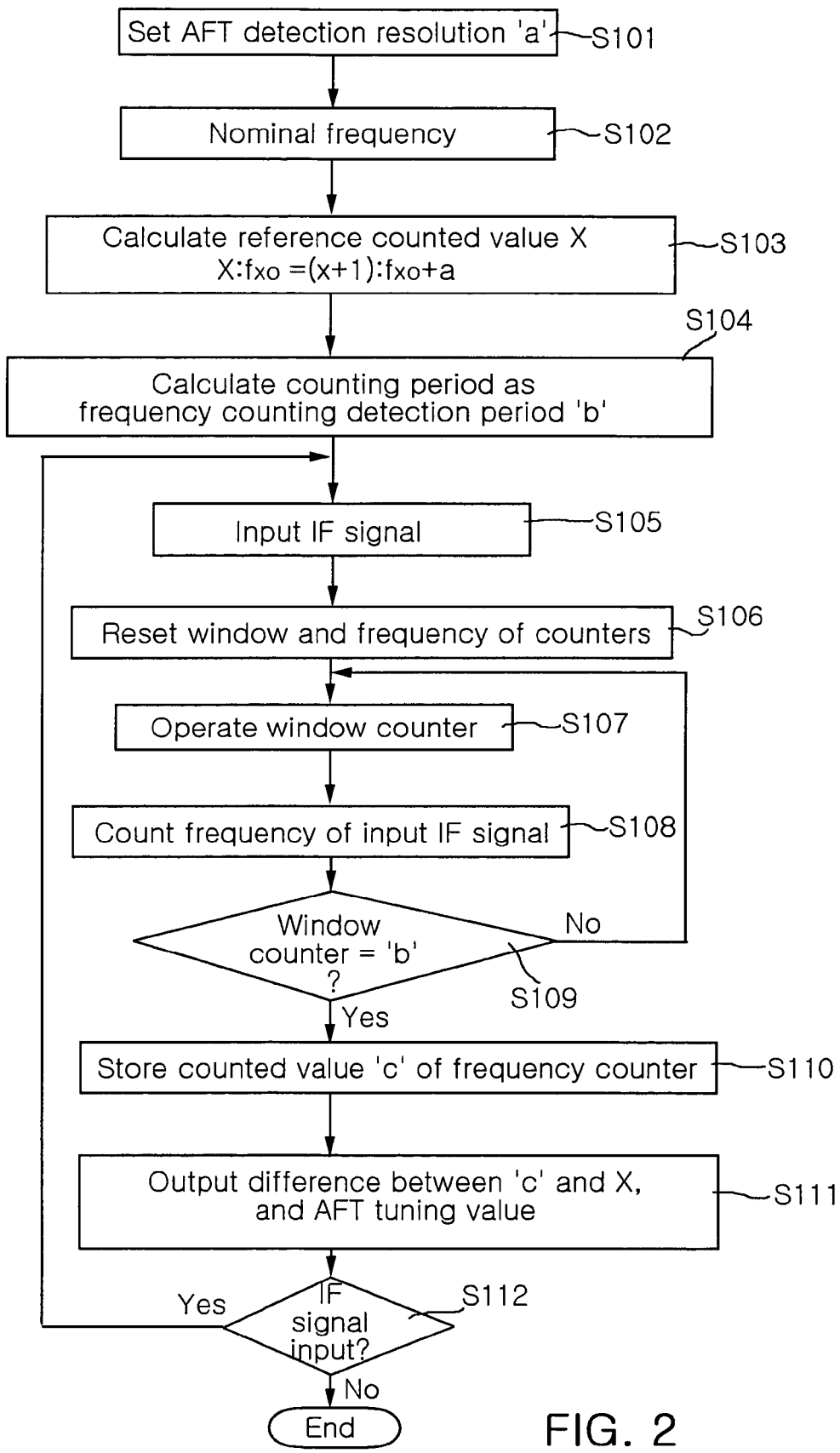
FIG. 2 is a flowchart showing a digital automatic fine tuning method according to a first embodiment of the present invention.

FIG. 2 is a flowchart showing a digital automatic fine tuning method according to a first embodiment of the present invention.

The digital automatic fine tuning of the present invention uses the principle of applying the frequency of an IF signal as a clock of a counter and detecting the frequency of the IF signal using a counted value. In the digital automatic fine tuning method of the present invention, a detection resolution 'a' for the automatic fine tuning is set at step S101. The detection resolution 'a' is a unit detectable minimal difference between the difference of an IF and a nominal frequency at the time of digital automatic fine tuning.

Thereafter, an initial value is set to a precise IF, that is, a nominal frequency $f_0$ at step S102.

After the initial value is set, a reference counted value X is calculated from the nominal frequency $f_0$ and the detection resolution 'a' according to the following Equation 1 at step S103.

$$X:f_0=X+1:f_0+a \qquad (1)$$

Thereafter, a counting period required to be counted from the reference counted value X to the nominal frequency $f_0$ by X is calculated as a frequency counting detection period b (hereinafter referred to as a "window period") at step S104.

For example, when the nominal frequency $f_0$ is 45.75 MHz and the detection resolution 'a' for the automatic fine tuning is 25 MHz, the reference counted value X is calculated to be 1830. In this case, the window period T becomes 40 μs, 25 KHz in terms of frequency. In this case, a detection resolution of 25 KHz means that a frequency difference of ±25 KHz around the nominal frequency of 45.75 MHz can be detected.

In this way, when the initialization of control parameters is completed, an IF signal to be detected is input at step S105.

Thereafter, a window counter for counting the window period and a frequency counter unit for counting a frequency are reset to respective initial values S106. In this case, the initial values may be 0 in the case where the window counter and the frequency counter unit are up counters.

Thereafter, the window counter counts frequency detection time and the frequency counter unit counts a frequency of the input IF signal at steps S107 and S108.

Thereafter, it is determined whether a counted value of the window counter reaches the calculated window period 'b' at S109.

The window counter and the frequency counter unit continue to count until the counted value of the window counter reaches the window period 'b'.

When the counted value of the window counter reaches the window period 'b', a counted value 'c' of the frequency counter unit at that time is stored at step S110.

Thereafter, an automatic fine tuning signal corresponding to a difference between the stored counted value 'c' of the frequency counter unit and the reference counted value X set at the initialization step is output at step S111.

The automatic fine tuning signal can be output as digital data representing the difference between the counted value 'c' of the frequency counter unit and the reference counted value X, or can be output as a voltage signal in proportion to the difference between the counted value 'c' of the frequency counter unit and the reference counted value X.

The above-described steps S106 to S111 are repetitively performed whenever the IF signal is input at S112.

Figure 1:
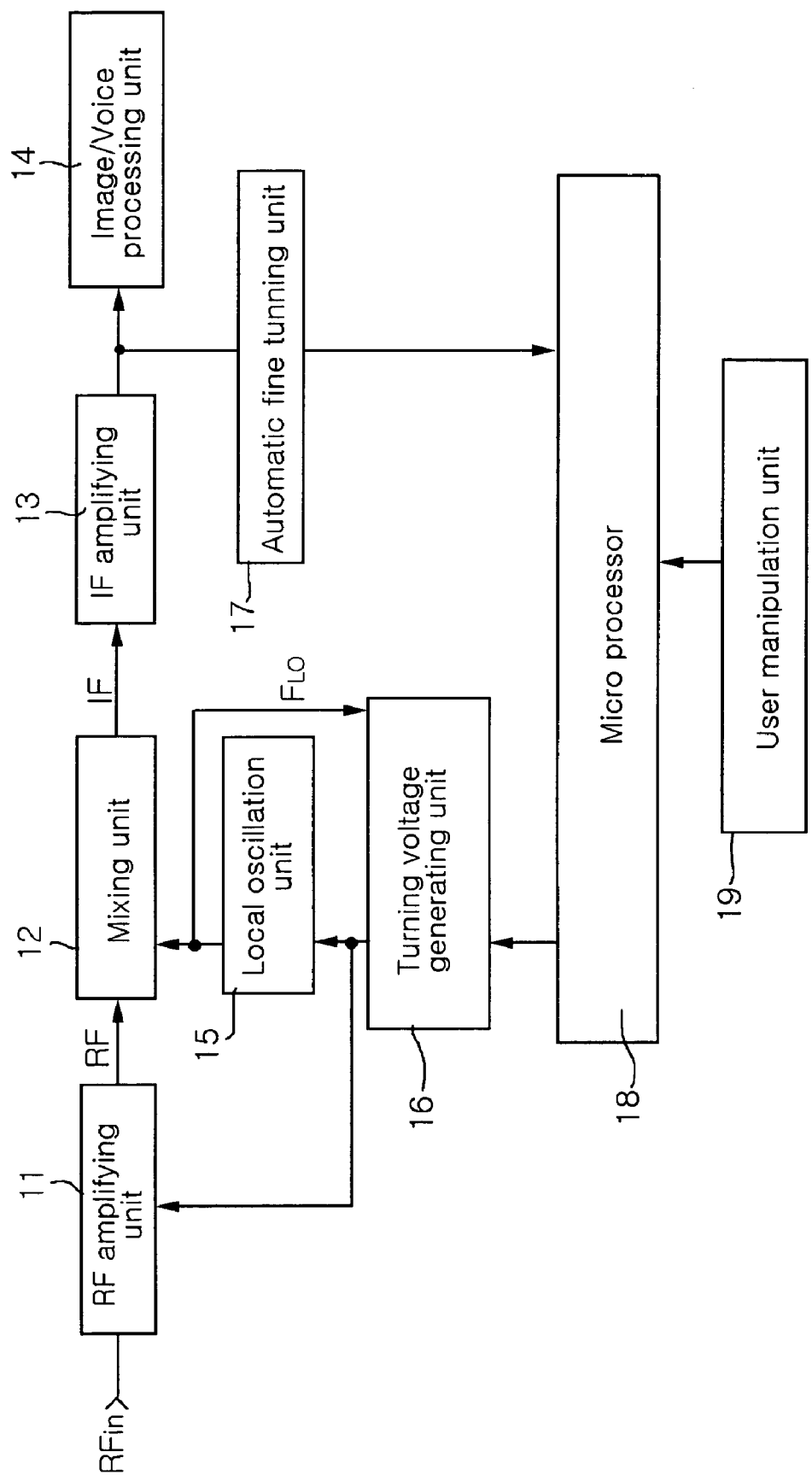
FIG. 1 is a schematic block diagram of a general tuner.

With the process as described above, an automatic fine tuning signal corresponding to the difference between the frequency of the IF signal output from the mixing unit 12 of FIG. 1 and the nominal frequency, which indicates the extent of deviation of a center carrier frequency of a received high broadcasting signal, can be generated without using an LC tank circuit.

Figure 3:
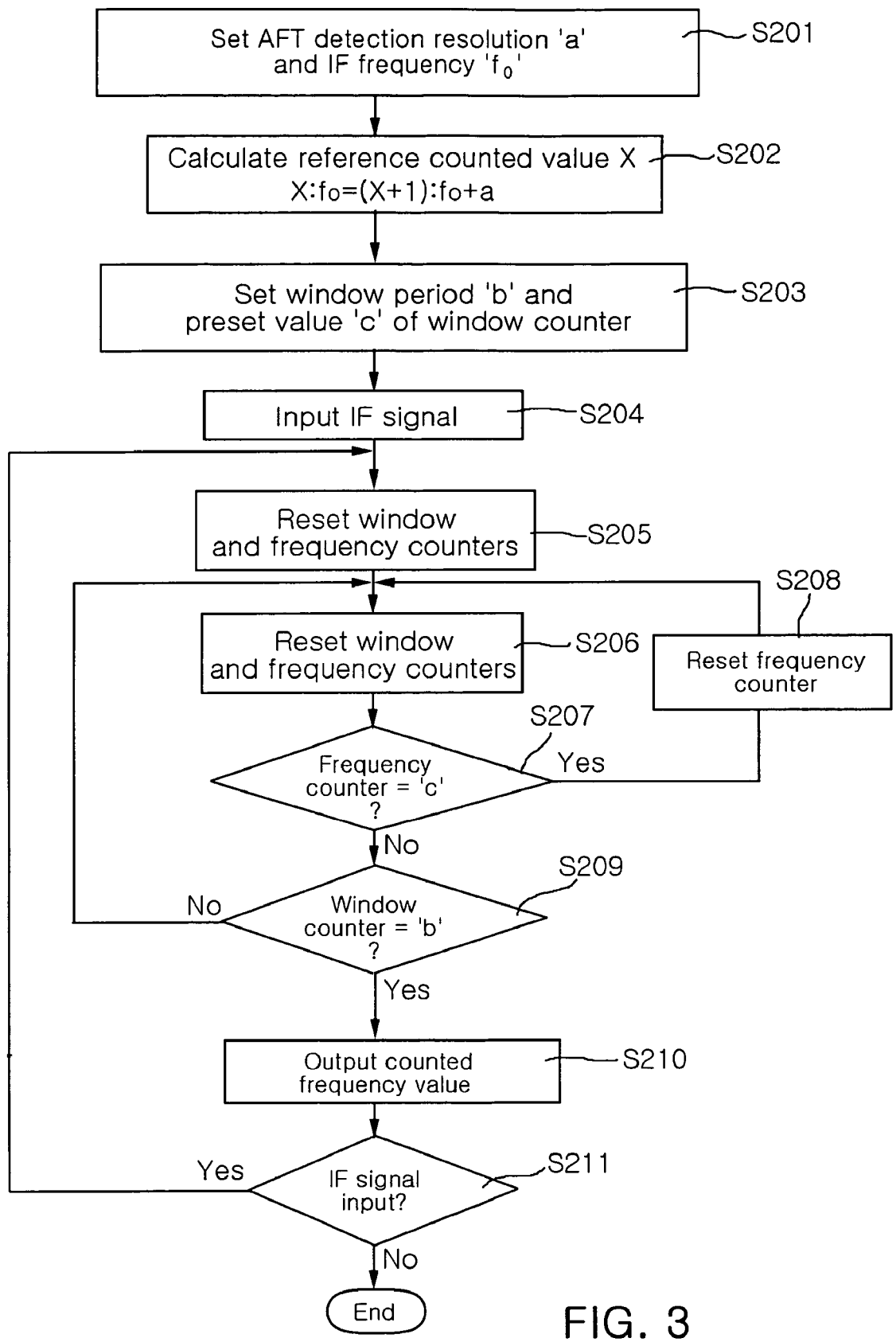
FIG. 3 is a flowchart showing a digital automatic fine tuning method according to a second embodiment of the present invention.

FIG. 3 is a flowchart showing a digital automatic fine tuning method according to a second embodiment of the present invention.

Like the first embodiment, the detection resolution 'a' for the automatic fine tuning and the precise IF, that is, the nominal frequency $f_0$, are set at step S201.

Thereafter, the reference counted value X is calculated by substituting the nominal frequency $f_0$ and the detection resolution 'a' into Equation 1 at step S202.

Thereafter, the counting period required to be counted from the reference counted value X to the nominal frequency $f_0$ by X is set to the window period 'b', and a preset value 'c' at the time of frequency counting is set at step S203.

In that case, the window period 'b' is the counting time required for one frequency detection. The preset value 'c', which is a preset value at the time of frequency counting of the IF signal to be detected, is set so that the counted values of all bits become "0" at an end point of the window period at the time of the frequency counting of the nominal frequency, based on the reference counted value X.

For example, when the nominal frequency $f_0$ is 45.75 MHz and the detection resolution 'a' for the automatic fine tuning is 25 MHz, the reference counted value X is calculated to be 1830. In this case, the window period T becomes 40 μs, or 25 KHz in terms of frequency. If the frequency counting is performed in a counting-down way, the preset value 'c' is 1819. In other words, the counted frequency value during the window period is 1830 in the case of a frequency equal to the nominal frequency. Accordingly, when an IF signal input as a clock signal is repetitively counted from 1818 to 0 in the counting-down way during the window period 'b', the counted frequency value at a point of time of the window period 'b' when the IF signal of the frequency equal to the nominal frequency is input is 1808. When this counted value is expressed in binary data, all certain lowest bits (for example, four bits) become "0000". Accordingly, the counted frequency values of the IF signal can be symmetrically shown in + and − directions in proportion to ± differences based on the nominal frequency, as shown in table 1 below. In general, in the case where the automatic fine tuning signal is applied to the tuner as an analog current or voltage, a decoder for converting the counted frequency value into digital data representing a frequency difference between the counted frequency value and the nominal frequency is required, so as to convert the analog current or voltage into an analog signal representing a difference between the counted frequency value and the reference counted value. However, when the preset value is set as described above and the counted frequency value is output as shown in table 1, the counted frequency value itself can be input into a digital/analog converter unit without a need of decoding, which will be described in more detail later.

TABLE 1

| IF signal ($f_{IF}$) | | Counted frequency value (four lowest bits) | | | | AFC signal |
|---|---|---|---|---|---|---|
| Reference frequency (MHz) | Frequency range | Q3 | Q2 | Q1 | Q0 | $I_{AFC}$ (μA) |
| 45.575 | ≦$f_0$−0.1875 | 0 | 1 | 1 | 1 | 175 |
| 45.600 | ~$f_0$−0.1625 | 0 | 1 | 1 | 0 | 150 |
| 45.625 | ~$f_0$−0.1375 | 0 | 1 | 0 | 1 | 125 |
| 45.650 | ~$f_0$−0.1125 | 0 | 1 | 0 | 0 | 100 |
| 45.675 | ~$f_0$−0.0875 | 0 | 0 | 1 | 1 | 75 |
| 45.700 | ~$f_0$−0.0625 | 0 | 0 | 1 | 0 | 50 |
| 45.725 | ~$f_0$−0.0375 | 0 | 0 | 0 | 1 | 25 |
| 45.750 | ~$f_0$−0.0125 | 0 | 0 | 0 | 0 | 0 |
| 45.775 | ~$f_0$+0.0125 | 1 | 1 | 1 | 1 | 25 |
| 45.800 | ~$f_0$+0.0375 | 1 | 1 | 1 | 0 | 50 |
| 45.825 | ~$f_0$+0.0625 | 1 | 1 | 0 | 1 | 75 |
| 45.850 | ~$f_0$+0.0875 | 1 | 1 | 0 | 0 | 100 |
| 45.875 | ~$f_0$+0.1125 | 1 | 0 | 1 | 1 | 125 |
| 45.900 | ~$f_0$+0.1375 | 1 | 0 | 1 | 0 | 150 |
| 45.925 | ~$f_0$+0.1625 | 1 | 0 | 0 | 1 | 175 |
| 45.950 | ~$f_0$+0.1875 | 1 | 0 | 0 | 0 | 200 |

In this way, when the initialization of control parameters is completed, an IF signal to be detected is input at step S204.

Thereafter, the window counter and the frequency counter unit are reset to respective initial values at step S205.

Thereafter, the frequency counter unit counts the frequency of the input IF signal and the window counter counts the counting time of the frequency counter unit at step S206.

Thereafter, it is determined whether the counted value of the frequency counter unit reaches the preset value during the counting operation at step S207. When the counted value of the frequency counter unit reaches the preset value, the frequency counter unit is again reset to the initialization value at step S208 and, thereafter, the frequency counting operation for the input IF signal is repeated. In this case, the initialization value of the frequency counter unit as a down counter can be set to the preset value, and the initialization value of the window counter, which is an up counter, can be set to "0".

In addition, it is determined whether a counted value of the window counter reaches the window period 'b' during the counting operation at step S209.

If, as the result of the check in the step S209, the counted value of the window counter equals the window period 'b', the lowest bits of the counted value of the frequency counter unit are output as the automatic fine tuning signal at step S210. In this case, the lowest bits of the counted frequency value can be output as digital data, or can be output after being converted into an analog current or voltage signal by means of the digital/analog converter unit. The output automatic fine tuning signal has a value in proportion to a difference between the frequency of the input IF signal and the nominal frequency.

The above steps S205 to S210 are repetitively performed whenever the IF signal is input at step S211.

Now, an apparatus to which the digital automatic fine tuning method as described above is applied will be described.

Figure 4:
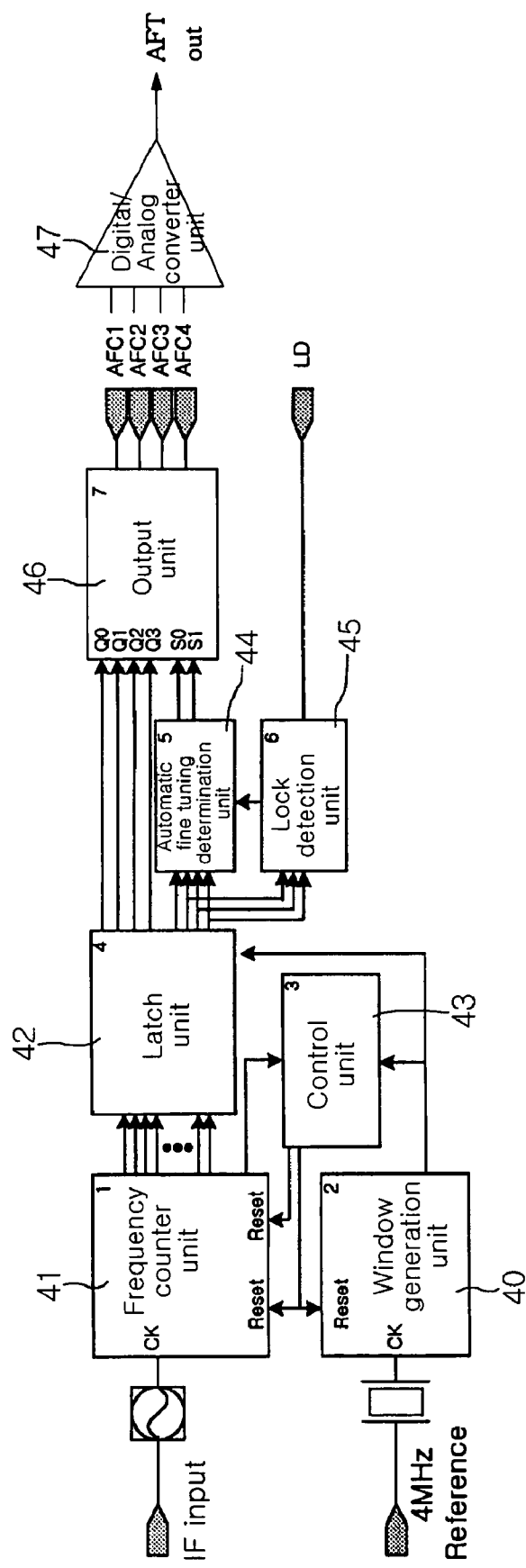
FIG. 4 is a block diagram of a digital automatic fine tuning apparatus according to the present invention.

FIG. 4 is a block diagram of a digital automatic fine tuning apparatus according to the present invention. The apparatus includes a frequency counter unit 41 for receiving an IF signal and counting a frequency of the IF signal, a window generation unit 40 for generating a clock signal repeated at a window period set by the frequency division of a reference frequency (for example, 4 MHz), a control unit 43 for resetting or presetting the frequency counter unit 41 based on the clock signal generated in the window generation unit 40 and synchronizing the frequency counter unit 41 with the window generation unit 40, a latch unit 42 for temporarily storing counted values of the frequency counter unit within a frequency detection period under the control of the control unit 43, an automatic fine tuning determination unit 44 for receiving a bit value of the counted frequency values stored in the latch unit 42 and determining whether a frequency difference between the nominal frequency and the frequency of the IF signal falls within an automatic fine tuning range, a lock detection unit 45 used as an automatic phase control switch APC_SW for outputting a 'Low' level voltage signal if the frequency of the input IF signal falls within a range of ±2 MHz from an IF of 45.75 MHz, and otherwise, outputting a 'High' level voltage signal, an output unit 46 for dividing a frequency interval into a first interval in which a frequency difference increases in a − direction, a second interval within the automatic fine tuning range, and a third interval in which the frequency difference increases in a + direction, based on the determination in the automatic fine tuning determination unit 44, outputting data representing a corresponding interval for the first and third intervals, and digital data corresponding to the frequency difference for the second interval, and a digital/analog converter unit 47 for converting the digital data output from the output unit 46 into an analog signal and outputting the converted analog signal.

In the above construction, as described earlier, the window generation unit 40 generates a window signal having a period required to count the detection resolution 'a', the nominal frequency $f_0$, and the reference counted value X calculated from them. The window generation unit 40 can be implemented as a crystal oscillator for generating a reference frequency and a counter for dividing the reference frequency generated in the crystal oscillator and generating a clock signal having the window period. For example, when a clock signal of 25 KHz corresponding to the window period of 40 μs has to be generated, as described above, the window generation unit 40 is implemented as the crystal oscillator of 4 MHz and the counter for dividing a 4 MHz oscillation signal from the crystal oscillator by 160 and outputting the clock signal of 25 KHz. The window signal output from the window generation unit 40 is transmitted to the control unit 43 and the latch unit 42.

The frequency counter unit 41 can be implemented as an up/down counter for counting up or down an IF signal received from a clock stage.

Thereafter, the latch unit 42, which is a means for temporarily storing counting data output from the frequency counter unit 41, is synchronized with the window signal applied from the window generation unit 40 and maintains a counted value generated during the window period until a counted value at a next window period is generated. Accordingly, the stored data is updated every window period (for example, 40 μs).

The control unit 43 simultaneously resets the window generation unit 40 and the frequency counter unit 41 to cause them to be synchronized with each other. Thereafter, the control unit 43 controls the presetting of the frequency counter unit 41 so that counting data are symmetrical with respect to each frequency difference as shown in table 1. In other words, the control unit 43 receives a counted value from the frequency counter unit 41 and applies a presetting signal to the frequency counter unit 41 when the counted value reaches a preset value, so that counting is performed from an initialization value.

Figure 5:
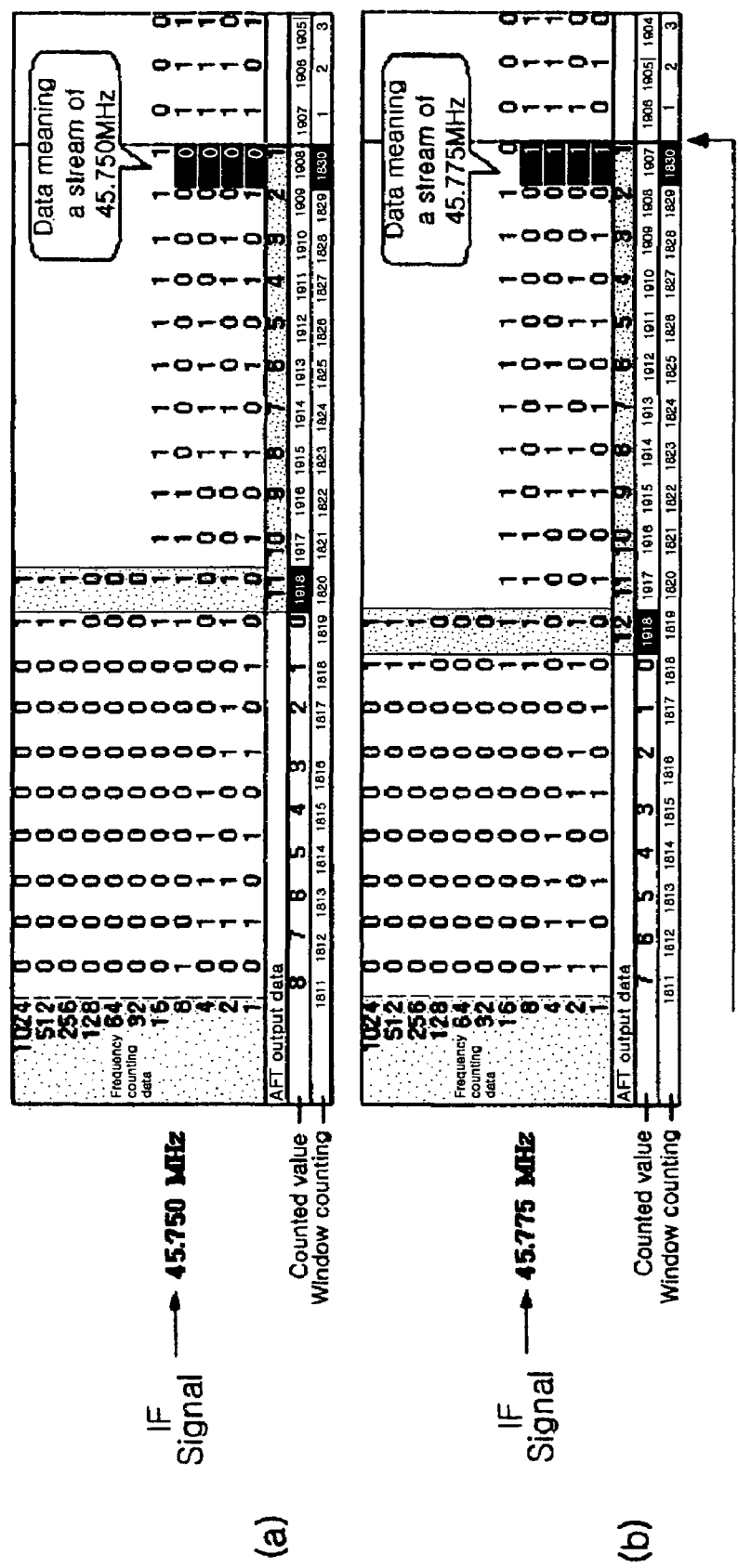
FIGS. 5a and 5b are tables showing automatic fine tuning data output according to the second embodiment of the present invention.

FIGS. 5a and 5b are tables showing data output of each block in the digital automatic fine tuning apparatus as shown in FIG. 4, according to the second embodiment, where the detection resolution is 25 KHz, the reference counted value is 1830, the window period is 40 μs (1830), the nominal frequency is 45.750 MHz, the frequency counter unit 41 is a down counter, and the initialization value of the frequency counter unit 41 is 1818.

FIG. 5a shows the case where the IF signal of 45.750 MHz equal to the nominal frequency is input, and FIG. 5b shows the case where the IF signal of 45.775 MHz having a difference of 25 KHz between the frequency of the IF signal and the nominal frequency. Both cases are simultaneously reset by the control unit 43, and the frequency counter unit 41 receives the IF signals from a clock stage and begins to count down from 1818. When the counted value of the frequency counter unit 41 becomes 0, the frequency counter unit 41 is again preset by the control unit 43, and then begins to count down from 1818. The shaded portions of FIGS. 5a and 5b represent points of time when respective preset operations start. After the preset operations start, the counting operation is again performed. At the time of reaching the window period (40 μs, or 1830 in terms of the window counted value) directed by the window generation unit 40, the data of the four lower bits ($2^3$, $2^2$, $2_1$, $2^0$) of the frequency counter unit 41 are "0000" in the case of the IF signal of 45.750 MHz as shown in FIG. 5a, and "1111" in the case of the IF signal of 45.775 MHz as shown in FIG. 5b.

Accordingly, in FIG. 4, the output unit 46 extracts the data of lower bits from counted frequency data output from the latch unit 42 at the window period (40 μs) and outputs the extracted data as AFT data representing a frequency difference.

However, generally, in the tuner, the range of frequency differences adjustable by the automatic fine tuning unit is about 200 KHz, and frequency adjustment for a range beyond the frequency difference range is irrelevant. If a frequency difference beyond the frequency difference range occurs, the frequency is performed by the local oscillation unit 15. Accordingly, by checking the values of the concerned bits of the counted frequency data output through the latch unit 42, the automatic fine tuning determination unit 44 determines whether a frequency difference falls within the automatic fine tuning range and informs the output unit 46 of the result of the determination. If it is determined that the frequency difference falls within the automatic fine tuning range, the output unit 46 outputs automatic fine tuning data corresponding to the frequency difference.

Figure 6:
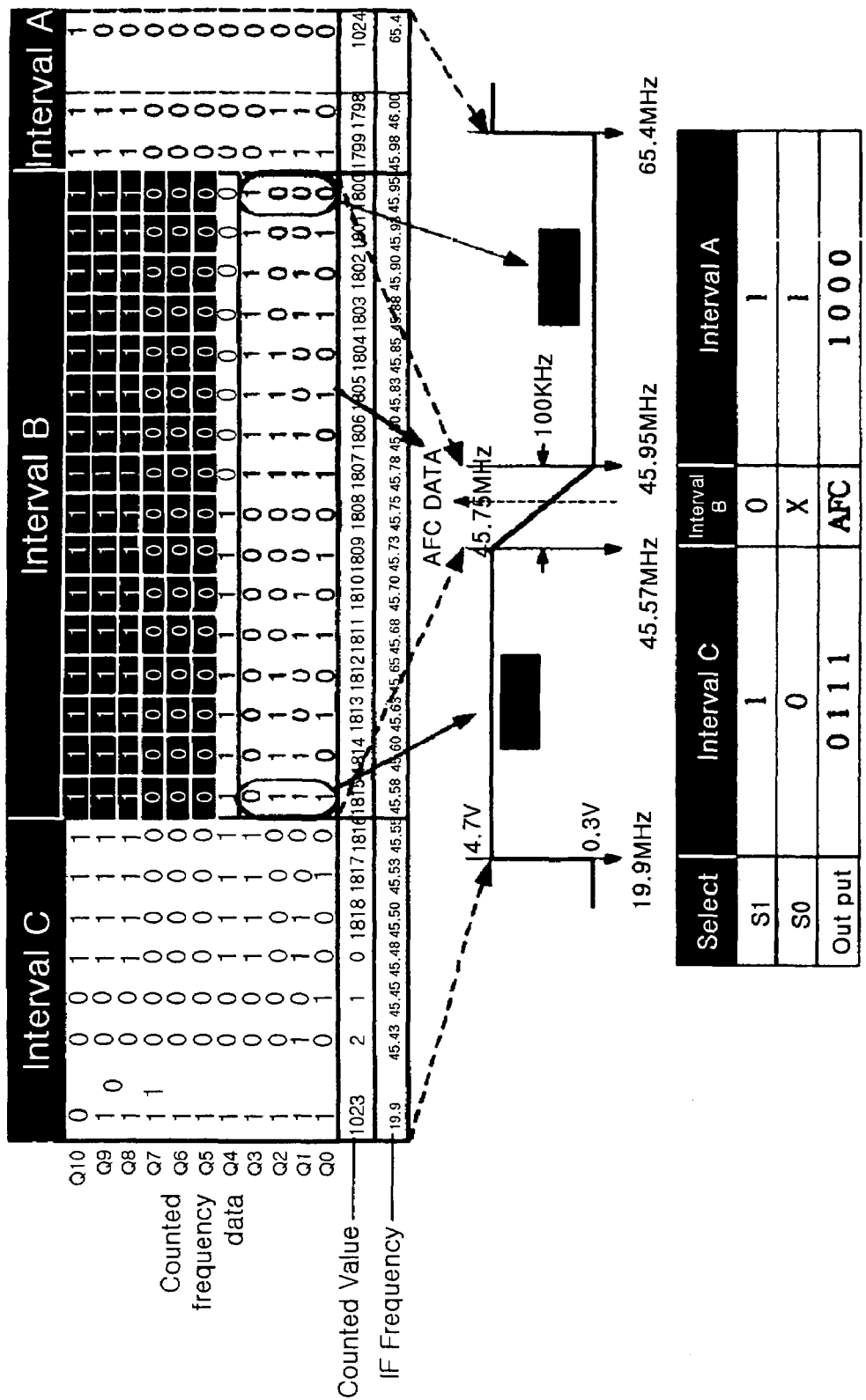
FIG. 6 is a table showing the operation results of the digital automatic fine tuning apparatus according to the present invention.

FIG. 6 is a table showing an example of an output of an automatic fine tuning signal in a frequency-voltage graph for the automatic fine tuning when the nominal frequency is 45.750 MHz, in accordance with the second embodiment of the present invention, where a frequency interval within an automatic fine tuning range of 45.57 MHz to 45.95 MHz is set to an interval B, a frequency interval above 45.95 MHz is set to an interval A, and a frequency interval below 45.57 MHz is set to an interval C.

In FIG. 6, the counted frequency data of 11 bits indicated in the upper portion of the table represent counting data at the time of counting during the window period for IF signals having respective corresponding frequencies, counted values represented by the counted frequency data are expressed in a decimal number, and a frequency-voltage curve of the automatic fine tuning unit is indicated in the lower portion of the table.

In FIG. 6, the data of the four lower bit of the counted frequency data in the interval B, which is the automatic fine tuning interval, are indicated to be symmetrical around the nominal frequency of 45.75 MHz.

The automatic fine tuning determination unit 44 reads the counted frequency data as shown in FIG. 6 and determines where the counted frequency value falls in the interval A, B or C.

In other words, if the counted frequency value falls within a range of 1815 to 1800 corresponding to the automatic fine tuning frequency range of 45.58 MHz to 45.95 MHz, an output value S1 is 1. Otherwise, S1 is 0. If the counted frequency value falls above 1815, an output value S2 is 0. If the counted frequency value falls below 1800, the output value S2 is 1.

Accordingly, the output unit 46 checks the output values Si and S2 of the automatic fine tuning determination unit 44, outputs the data of the four lower bits of the counted frequency data as the automatic fine tuning data regardless of the value of S2 if S1 is 0, and outputs "0111" or "1000" depending on S2 if S1 is 1.

The automatic fine tuning data output from the output unit 46 can be applied to the microprocessor 18, or after being converted into an automatic fine tuning voltage (0.3 V–4.7 V) signal through the digital/analog converter unit 47.

In this case, since the automatic fine tuning data output from the output unit 46 to correspond to the interval B are symmetrical around 45.75 MHz having no frequency difference, as shown in table 1, they can be converted in the digital/analog converter unit 47 without decoding.

Thereafter, FIGS. 7a to 7i show the input and output signals of each block, measured at the time of the input of the IF signal of 45.75 MHz into the digital automatic fine tuning apparatus as shown in FIG. 4, where FIG. 7a is a timing diagram of AFC1 of the automatic fine tuning data output from the output unit 46, FIG. 7b is a timing diagram of $2^1$ bit of output data of the frequency counter unit 41, FIG. 7c shows a signal of AFC0 of the automatic fine tuning data output from the output unit 46, FIG. 7d is a timing diagram of $2^0$ bit of output data of the frequency counter unit 41, FIG. 7e shows an IF input signal, FIG. 7f shows a reset signal of the frequency counter unit 41, FIG. 7g shows a reset signal of the window generation unit 40, FIG. 7h shows a detection command signal of a counted frequency value applied from the window generation unit 40 to the control unit 43 and the latch unit 42, and FIG. 7i shows an output signal of the crystal oscillator to generate a reference signal of 4 MHz to be used to count the window period in the window generation unit 40.

Figure 7:
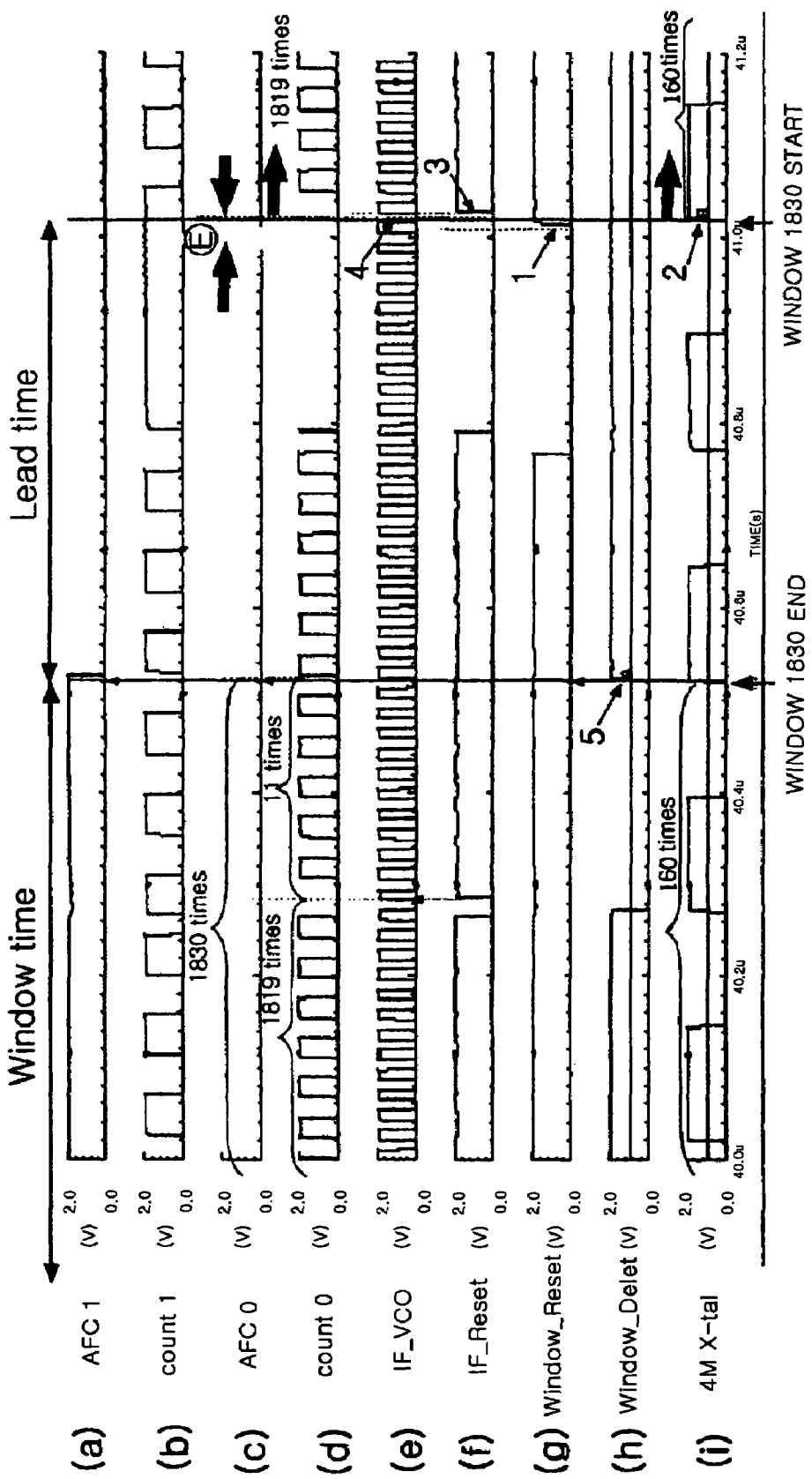
FIG. 7 is a timing diagram showing an output signal of each block at the time of input of an IF of 45.75 MHz in the digital automatic fine tuning apparatus according to the present invention.

As shown in FIG. 7, in order to synchronize the window generation unit 40 with the frequency counter unit 41, the control unit 43 applies a reset signal to the window generation unit 40 and the frequency counter unit 41 to cause them to be reset. In this case, in order to perform frequency counting in synchronization with the reference signal shown in FIG. 7i, a window reset signal ① appears immediately before a window start signal ② appearing in the reference signal of 4 MHz shown in FIG. 7i. To accomplish this, a clock signal used for the counting of the window generation unit 40 is implemented so that the clock signal precedes the reference signal of FIG. 7i in phase. For example, the reference signal generated in the 4 MHz crystal oscillator is delayed by means of a delay cell and each of a before delay signal and an after delay signal of the delay cell can be used as clock signals.

Simultaneously, the frequency counter unit 42 starts the frequency counting. In this case, since the window reset signal ① should precede a clock of the frequency counter unit 41, as shown in FIG. 7g, a reset input should be given 1820 times for that purpose. However, in this case, since output data may be presented differently from data in table 1 when a finally counted frequency value is detected, the reset signal in the frequency counter unit 42 conforms to 1818 and, instead, is applied as shown in FIG. 6f so as to delay the IF counting by one clock. In this case, since a signal delay is within one clock period (21.8 ns), precise detection can be achieved within the range of a detection resolution of 25 KHz.

In addition, a detection signal ⑤ of high level is output from a point when a window period of 40 μs elapses from the reference point ①, that is, from an end point of the window period. The detection signal ⑤ of high level is maintained for 40 μs synchronized with the window period. Accordingly, the latch unit 42 operates according to the detection signal ⑤ and maintains the output data of the frequency counter unit 41 at the end point of 40 μs of the window period for 40 μs.

In other words, the states of the counted frequency values of FIGS. 7b and 7d at the end point of window period are maintained as the automatic fine tuning data for a predetermined time 40 μs, as shown in FIGS. 7a and 7c.

Figure 8:
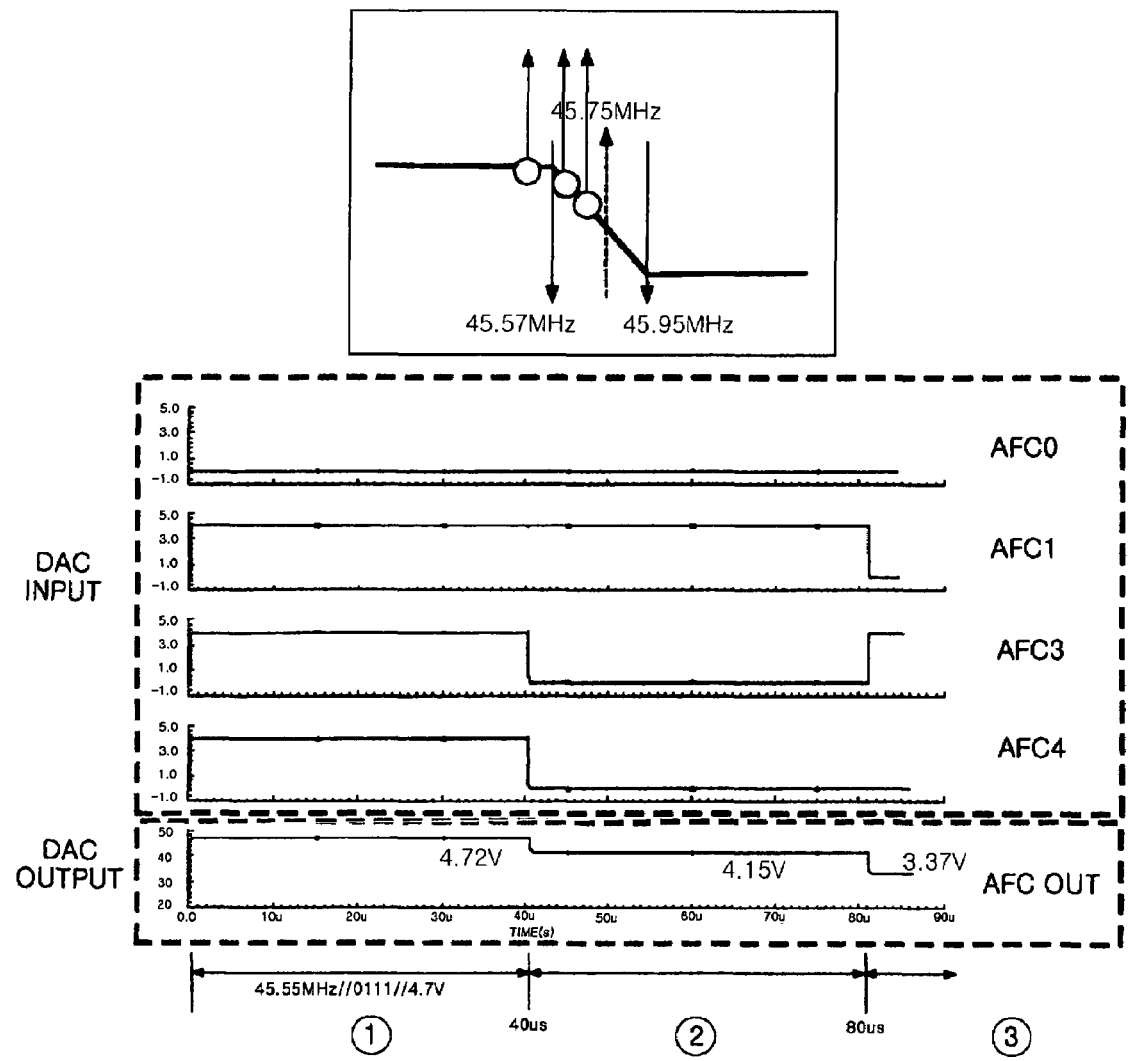
FIG. 8 is a timing diagram showing the simulation results of the digital automatic fine tuning apparatus according to the present invention.

FIG. 8 shows the simulation results of the digital automatic fine tuning apparatus as shown in FIG. 4. The simulation results shown in FIG. 8 are results that are obtained by measuring the automatic fine tuning data AFC0 to AFC3 output from the output unit 46 when the frequency of the IF input signal is changed from 45.55 MHz through 45.64 MHz to 45.68 MHz, and the automatic fine tuning signal AFT OUT output from the digital/analog converter unit 47.

As can be seen from the simulation results, "0111" is output as the automatic fine tuning data at 45.55 MHz falling within the interval C and a corresponding automatic fine tuning signal has a highest voltage of 4.72V. When the frequency is changed to 45.64 MHz, the automatic fine tuning data is changed to "0100" and the automatic fine tuning signal is changed to have a voltage of 4.15V. Subsequently, when the frequency is changed to 45.68 MHz, the automatic fine tuning data is changed to "0010" and the automatic fine tuning signal is changed to have a voltage of 3.37V.

Figure 9:
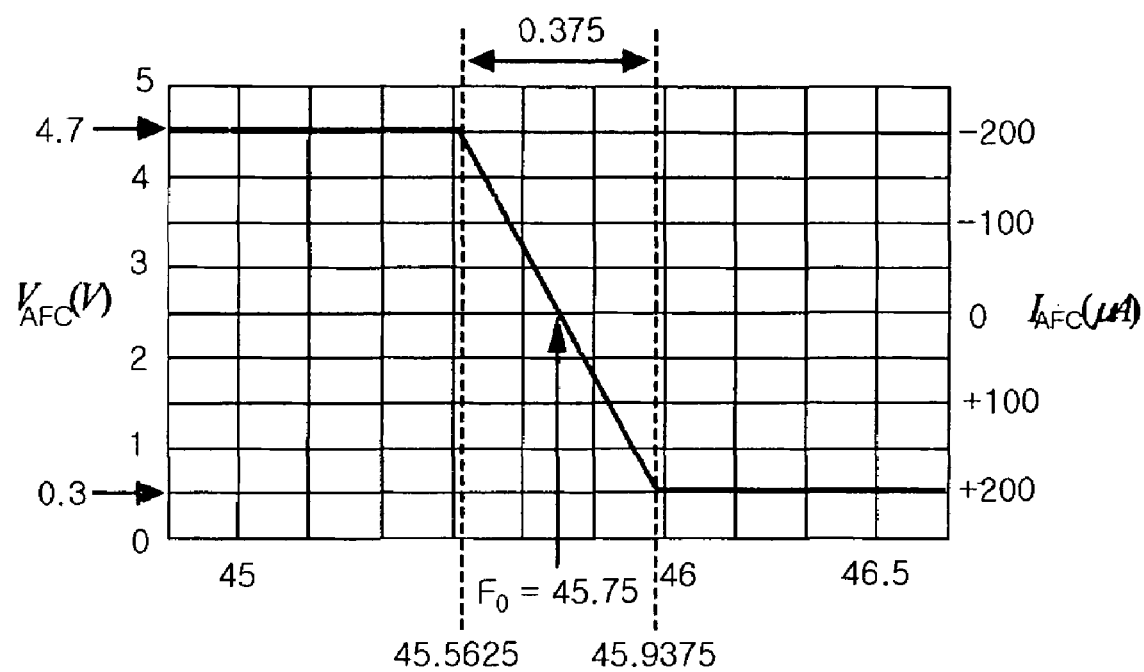
FIG. 9 is a graph showing a frequency-voltage curve for automatic fine tuning, which is applied to a tuner of a NTSC type.

FIG. 9 is a graph showing a frequency-voltage curve for automatic fine tuning, which is applied to a tuner of a NTSC type, where a voltage of 2.5V is applied at the nominal frequency of 45.75 MHz, a voltage is added or subtracted by a corresponding frequency difference based on this application, and an automatic fine tuning voltage has a range of 0.3V to 4.7V.

From the comparison of the simulation results of FIG. 8 and the frequency-voltage curve of FIG. 9, it can be appreciated that the automatic fine tuning signal according to a standard is generated.

As described above, the present invention provides a digital automatic fine tuning method and apparatus, which is capable of detecting the frequency of an IF signal and generating an automatic fine tuning voltage corresponding to a difference between the IF frequency and a nominal frequency without using a tank circuit differently from an existing analog method, can be simply fabricated using a counting means and a latch unit, and does not require a decoding means.

Furthermore, since the automatic fine tuning apparatus of the present invention does not require any variable coil for tuning and can use a VCO with a RC circuit integrated therein, a tuner can be downsized.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A digital automatic fine tuning method, comprising the steps of:
    setting a frequency detection resolution 'a' of an Intermediate Frequency (IF) signal and a nominal frequency $f_0$;
    calculating a reference counted value X from the nominal frequency $f_0$ and the detection resolution 'a' according to the follow Equation, $X:f_0=X+1:f_0+a$, and a window period 'b' which is time required to count to the reference counted value X;
    receiving an IF signal;
    resetting a window counter for counting the window period and a frequency counter unit for counting a frequency to respective initial values;
    counting frequency detection time using the window counter and a frequency of the received IF signal using the frequency counter unit;
    determining whether a counted value of the window counter reaches the calculated window period 'b';
    if it is determined that the counted value of the window counter reaches the window period 'b', detecting a counted value 'd' of the frequency counter unit; and
    outputting an automatic fine tuning signal corresponding to a difference between the detected counted value 'd' and the calculated reference counted value X and returning to the step of resetting.

2. The digital automatic fine tuning method according to claim 1, further comprising the steps of:
    before the step of receiving the IF signal, setting a preset value 'c' so that state values of predetermined bits become "0" at an end point of the window period at the time of the frequency counting of the IF signal having a frequency equal to the nominal frequency, on the basis of the calculated reference counted value X;
    after the step of counting the frequency using the window counter and the frequency counter unit, determining whether a counted frequency value reaches the preset value 'c'; and
    if it is determined that the counted frequency value reaches the preset value 'c', presetting the frequency counter unit to an initialization value,
    wherein the step of outputting the automatic fine tuning signal is performed in such a way that counted frequency data detected at the end point of the window period are output as automatic fine tuning data.

3. The digital automatic fine tuning method according to claim 1, wherein only data of predetermined lower bits of the counted frequency data detected at the end point of the window period are used as the automatic fine tuning data.

4. A digital automatic fine tuning apparatus, comprising:
    a frequency counter unit for receiving an IF signal and counting a frequency of the received IF signal;
    a window generation unit for generating a window signal to set a frequency detection period of the IF signal;
    a control unit for resetting or presetting the frequency counter unit based on the window signal generated in the window generation unit;
    a latch unit operated in response to the window signal output from the window generation unit to detect a counted value of the frequency counter unit at an end point of window and maintain the detected counted value for predetermined time; and
    an output unit for outputting a counted frequency value output from the latch unit as automatic fine tuning data representing a difference between the frequency of the IF signal and a nominal frequency.

5. The digital automatic fine tuning apparatus according to claim 4, wherein the frequency counter unit is a down counter for counting down from a preset value set in the control unit.

6. The digital automatic fine tuning apparatus according to claim 4, wherein the window generation unit comprises:
    an oscillating means for generating a predetermined reference frequency; and
    a counting means for dividing the reference frequency generated in the oscillating means and generating a window signal corresponding to a window period required to count a reference counted value.

7. The digital automatic fine tuning apparatus according to claim 4, further comprising an automatic fine tuning determination unit for checking the counted frequency value output from the latch unit and determining whether the received IF signal falls within an automatic fine tuning range, above the automatic fine tuning range, or below the automatic fine tuning range,
    wherein the output unit outputs the automatic fine tuning data when it is determined that the received IF signal falls within an automatic fine tuning range.

8. The digital automatic fine tuning apparatus according to claim 4, further comprising a digital/analog converter unit for converting the automatic fine tuning data output from the output unit into an analog signal according to a frequency-voltage curve for automatic fine tuning.

9. The digital automatic fine tuning apparatus according to claim 4, wherein the control unit sets a preset value so that state values of predetermined bits become "0" at an end point of the window period at the time of the frequency counting of the IF signal having a frequency equal to the nominal frequency on the basis of a reference counted value X that is a counted value of the nominal frequency, resets the window generation unit and the frequency counter unit by synchronizing them with each other, checks an operation of the frequency counter unit, and presets the frequency counter unit for a preset period.

* * * * *